US006937067B2

(12) United States Patent
Neaves

(10) Patent No.: US 6,937,067 B2
(45) Date of Patent: Aug. 30, 2005

(54) SYSTEM AND METHOD FOR BALANCING CAPACITIVELY COUPLED SIGNAL LINES

(75) Inventor: Philip Neaves, Surrey (GB)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 10/666,393

(22) Filed: Sep. 17, 2003

(65) Prior Publication Data
US 2004/0235265 A1 Nov. 25, 2004

(30) Foreign Application Priority Data

May 20, 2003 (GB) ................................ 0311604

(51) Int. Cl.[7] .................... H03K 19/00; H03M 7/00
(52) U.S. Cl. .................................. 326/93; 341/50
(58) Field of Search ........................ 326/26, 27, 82, 326/83, 93–98; 341/50, 51

(56) References Cited

U.S. PATENT DOCUMENTS

| 3,782,504 | A | * | 1/1974 | Billmaier et al. | ........... 187/380 |
| 4,280,221 | A | * | 7/1981 | Chun et al. | ............... 375/288 |
| 5,124,660 | A | | 6/1992 | Cilingiroglu | ............... 324/538 |
| 5,673,130 | A | | 9/1997 | Sundstrom et al. | ......... 359/158 |
| 5,786,979 | A | | 7/1998 | Douglass | ................... 361/328 |
| 5,818,112 | A | | 10/1998 | Weber et al. | ............... 257/777 |
| 5,974,464 | A | * | 10/1999 | Shin et al. | ................. 709/231 |
| 6,087,842 | A | | 7/2000 | Parker et al. | ............... 324/763 |

(Continued)

FOREIGN PATENT DOCUMENTS

| EP | 0 277 764 A3 | 1/1988 |
| EP | 0366263 A3 | 5/1990 |
| EP | 0 492 806 A3 | 11/1991 |
| EP | 0 805 356 A3 | 4/1998 |
| GB | 2 353 401 A | 2/2001 |
| GB | 2 353 402 A | 2/2001 |
| WO | WO 0215185 A1 | 2/2002 |

OTHER PUBLICATIONS

"International Technology Roadmap for Semiconductors", Assembly and Packaging, 2001, pp. 1–21.

(Continued)

Primary Examiner—Don Le
(74) Attorney, Agent, or Firm—Dorsey & Whitney LLP

(57) ABSTRACT

A signal balancing circuit for capacitively coupled signaling between transmitting and receiving devices over a plurality of capacitively coupled signal lines on which data signals are transmitted from the transmitting device to the receiving device. The signal balancing circuit includes an encode circuit for forcing a signal transition of a data signal for a data interval in response to the data signal maintaining the same logic state throughout a respective time interval. A balancing signal is generated having a logic level and a timing relative to the time intervals of the respective data signals indicative of inversion of a particular data signal. A decode circuit coupled to the encode circuit to receive the balancing signal forces a transition of the transitioned signal at the appropriate time in accordance with the balance signal to recover the original logic level of the data signal.

44 Claims, 4 Drawing Sheets

U.S. PATENT DOCUMENTS

| | | |
|---|---|---|
| 6,188,232 B1 | 2/2001 | Akram et al. ................ 324/755 |
| 6,242,941 B1 | 6/2001 | Vest et al. .................... 326/26 |
| 6,285,201 B1 | 9/2001 | Farnworth et al. .......... 324/755 |
| 6,310,494 B1 | 10/2001 | Ehben et al. ................. 326/82 |
| 6,357,025 B1 | 3/2002 | Tuttle .......................... 714/724 |
| 6,368,930 B1 | 4/2002 | Enquist ....................... 438/320 |
| 6,396,292 B2 | 5/2002 | Hembree et al. ........... 324/755 |
| 6,407,566 B1 | 6/2002 | Brunelle et al. ............ 324/758 |
| 6,425,107 B1 | 7/2002 | Caldara et al. .............. 714/759 |
| 6,490,188 B2 | 12/2002 | Nuxoll et al. ................. 365/63 |
| 6,496,889 B1 | 12/2002 | Perino et al. ................ 710/110 |
| 6,500,696 B2 | 12/2002 | Sutherland .................. 438/109 |
| 6,563,133 B1 | 5/2003 | Tong ............................ 257/52 |
| 6,563,299 B1 | 5/2003 | Van Horn et al. ........ 324/158.1 |
| 6,620,638 B1 | 9/2003 | Farrar .......................... 438/14 |
| 6,625,073 B1 | 9/2003 | Beffa .......................... 365/201 |
| 6,690,309 B1 * | 2/2004 | James et al. ................ 341/102 |
| 6,714,031 B2 | 3/2004 | Seki ............................ 324/763 |
| 6,859,883 B2 * | 2/2005 | Svestka et al. ............. 713/320 |
| 2001/0039075 A1 | 11/2001 | Doyle et al. ................ 438/107 |
| 2001/0054908 A1 | 12/2001 | Farnworth et al. .......... 324/755 |

OTHER PUBLICATIONS

Karnezos, M. et al., "System in a Package (SiP) Benefits and Technical Issues", in *Proceedings of* APEX, San Diego, California, 2002, 7 pages.

Mick, S. et al., "4Gbps High–Density AC Coupled Interconnection", Department of Electrical and Computer Engineering North Carolina State University, IEEE Custom Integrated Circuits Conference, May 12–16, 2002, pp. 133–140.

"Rapidly Advancing System–in–Package Fabrication Technology", vol. 20, No.3, 2002, pp. 3–11.

Scanlan, C.M. et al., "System–In–Package Technology, Application and Trends", 2001 Proceedings of SMTA International, Rosemont, Illinois, pp. 764–773.

Wang, M. et al., "Configurable Area–IO Memory for System–In–A–Package (SiP)", 27$^{th}$ European Solid–State Circuits Conference, Sep. 2001, 4 pages.

* cited by examiner

SYSTEM AND METHOD FOR BALANCING CAPACITIVELY COUPLED SIGNAL LINES

TECHNICAL FIELD

The present invention is related to system-in-package devices, and more particularly, to a system and method for providing capacitively coupled signaling in a system-in-package device.

BACKGROUND OF THE INVENTION

Traditional semiconductor integrated circuit technology is used to integrate various electronic circuits onto a common semiconductor substrate to form a system, or subsystem. However, the traditional approach to integrating circuits into a system has process, manufacturing and design limitations which make integrating some electronic circuitry onto a common semiconductor substrate impractical. A new integration technology, namely, system-in-package (SiP) technology, attempts to overcome the limitations of the traditional approach by interconnecting multiple discrete semiconductor systems on a common substrate and encapsulating the complete system in a common package. Generally, SiP enables the integration of a mix of technologies into one package that would otherwise be difficult and expensive using the traditional approach. For example, SiP technology has been successfully applied in mixed signal applications, such as RF/wireless applications and sensor applications, as well as in networking and computing applications, and other high speed digital applications.

As previously mentioned, the multiple discrete systems of an SiP are electrically coupled together to form a system and, as is well known in the art of digital electronics, many of the multiple systems communicate with one another by transmitting digital information in the form of electrical signals. Typically, even analog based systems included in the SiP have the analog signals converted into the digital domain. The electrical signals transmitted between the multiple systems represent a serial data stream where the data is represented as binary symbols having discrete levels of amplitude or phase, as well known. Multiple electrical signals are transmitted in parallel to transmit data of a data width, with each signal representing one bit of the width of data. Conventional signaling technologies between the multiple discrete systems in a SiP are generally based on standard off-die type signaling. However, it has been recognized that electrostatic discharge (ESD) requirements and load requirements can be relaxed since the signals are not being driven externally to the package of the SiP. In response, capacitively coupled signaling techniques have been employed between the multiple discrete systems of the SiP. Capacitively coupled signaling techniques provides various advantages over standard off-die signaling, such as, elimination of conventional circuits providing ESD protection, allowing devices having different voltage domains to be operated without level shifting, and low power consumption.

In a system using capacitively coupled signaling, the issue of DC balancing needs to be addressed. The requirement for DC balance in AC coupled signaling is necessary due to the nature of the bit patterns present in serial data streams. More specifically, long strings of ones or zeros can cause data recovery problems at the receiver due to the relatively constant voltage applied when strings of ones and zeros are transmitted charging and discharging the capacitive coupling between systems. As a result, the AC signal, which represents the transmitted data, can drift as the DC voltage level across the capacitive coupling changes. Additionally, the problem of DC balancing is exacerbated when the signaling is between devices operating in two different voltage domains, which may be the case in a SiP device. That is, the common-mode input at the receiver can vary enormously if the signal is not DC balanced, resulting in large common-mode variations at high bit-rates. As a result, data-recovery at the receiver is both difficult and complex.

One approach to the issue of DC balance has been to use Manchester encoding methods. Generally, in Manchester encoding binary digits are represented by a signal transition, and not the signal level, occurring within a bit boundary. That is, a "1" bit is typically represented by a rising edge of a signal (i.e., 0-to-1 transition) occurring during the bit period, and a "0" bit is represented by a falling edge of the signal (i.e., a 1-to-0 transition) occurring during the bit period. The encoding of bits in this manner may be alternatively viewed as a phase encoding where each bit is encoded by a positive 90 degree phase transition, or a negative 90 degree phase transition. Consequently, Manchester encoding is sometimes referred to as bi-phase encoding. Although Manchester encoding maintains DC balance, since any long strings of 1's or 0's results in a signal that oscillates between the high and low voltage values, it requires a bandwidth that is twice that of the bit-rate. That is, if the bit-rate is 400 Mbps, Manchester encoding requires a bandwidth of at least 800 Mbps. Thus, Manchester encoding sacrifices bandwidth by limiting bit-rates to no greater than one-half of the maximum available bandwidth.

Another conventional approach to the issue of DC balance is to use a "bit-stuffing" method. Generally, bit-stuffing involves "stuffing" extra transition bits into a bit-stream if a preset number of transitionless bits has been transmitted. The receiver follows the same protocol and removes the stuffed bit after the specified number of transitionless bits are received. For example, if the preset number is eight, and eight consecutive bits of a 1 or 0 are transmitted, the next bit, that is, the ninth bit, is inverted to cause a transition. Although bit-stuffing does address DC balance issues, encoding and decoding data at high speeds is non-trivial, and moreover, such a signaling scheme is inefficient since the "stuffed" bit does not carry any information.

Scrambling is another conventional approach that has been used to address the DC balance issue. In scrambling, the data is scrambled using a known pseudo-random sequence and then de-scrambled at the receiver using the same pseudo-random sequence. For example, an Boolean XOR function is often employed for scrambling and de-scrambling the data. However, even when using a pseudo-random sequence for scrambling, it is still possible for a string of 1's or 0's to occur. Thus, employing a scrambling method does not address the issue of DC balance entirely.

Therefore, there is a need for an alternative approach directed to addressing the DC balance issue arising from capacitively coupled signaling.

SUMMARY OF THE INVENTION

The present invention is directed to a signal balancing circuit for capacitively coupled signaling between transmitting and receiving devices over a plurality of capacitively coupled signal lines on which data signals are transmitted from the transmitting device to the receiving device. The signal balancing circuit includes an encode circuit having an output at which a balancing signal is provided, the encode circuit coupled to each capacitively coupled signal line to monitor each data signal over a respective time interval for a change in logic states. The encode circuit forces a signal transition of a data signal for a data interval in response to the data signal maintaining the same logic state throughout the time interval. The encode circuit further generates a balancing signal having a logic level and a timing relative to the time intervals of the respective data signals indicative of inversion of a particular data signal. The signal balancing circuit further includes a decode circuit coupled to the encode circuit to receive the balancing signal and further coupled to the capacitively coupled signal lines to invert the data signals for the data interval according to the logic level and timing of the balancing signal.

In another aspect of the invention, a method for balancing a plurality of data signals on a corresponding plurality of capacitively coupled data lines is provided. The method includes evaluating the data signals for signal transitions occurring within a respective time interval, where each data signal has a time interval of equal time and is staggered in time with respect to the time intervals of the other signals. Where a data signal maintains the same logic level for the time interval, a signal transition of the data signal is forced from an original logic level to a complementary logic level, and a balance signal having a logic level and timing with respect to the time interval of the data signal indicative of the forced transition of the particular data signal is generated. A transition of the transitioned signal is forced at the appropriate time in accordance with the balance signal to recover the original logic level of the data signal.

DETAILED DESCRIPTION OF THE INVENTION

Embodiments of the present invention provide an alternative capacitively coupled signaling system that does not require encoding of the data signals being transmitted by a transmitting device to a receiving device. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
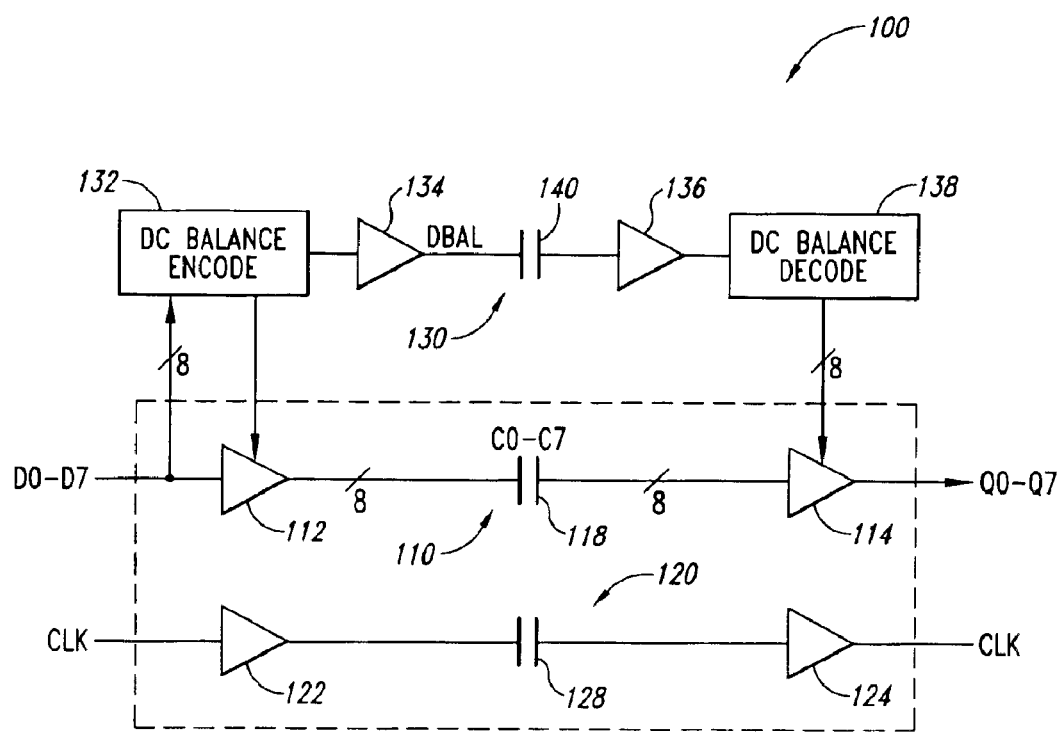
FIG. 1 is a block diagram of a capacitively coupled signaling system according to an embodiment of the present invention.

FIG. 1 illustrates a capacitively coupled signaling system 100 according to an embodiment of the present invention. In the particular embodiment illustrated, a capacitively coupled data bus 110 eight bits wide is used to transmit data signals D0–D7. The data bus 110 includes an output driver circuit 112 of the transmitting device capacitively coupled through capacitors 118 to an input buffer circuit 114 at the receiving device. The received data has been represented by the received data signals Q0–Q7. As shown in FIG. 1, the data bus 110 has been illustrated as a uni-directional data bus, with the output driver 112 representing a transmitting device and the input buffer 114 representing a receiving device. However, it will be appreciated that the data bus 110 has been illustrated in this manner by way of example, and that the data bus 110 can be a bi-directional data bus as well. Such bi-directional data busses are well known in the art. The output driver circuit 112, input buffer circuit 114, and capacitors 118 are conventional in design and can be implemented using well known techniques. It will be appreciated that the capacitors 118 are shown in FIG. 1 as discrete elements, however, the capacitors can be integrated into circuitry of the output driver or the input buffer, as well as integrated into the data bus itself using well known designs and manufacturing processes.

The capacitively coupled signaling system 100 further includes a capacitively coupled clock signal line 120 to transmit a clock signal CLK to the receiving device for the purpose of synchronizing the operation of the transmitting and receiving devices. As will be discussed in more detail below, the CLK signal is used to synchronize the encoding and decoding of the data signals in order for the receiving device to properly extract the data signals. The clock signal line 120 includes output clock driver 122 coupled through a capacitor 128 to an input clock buffer 124 at the receiving circuit. The clock signal line 120, output clock driver 122, clock buffer 124 and capacitor 128 are conventional in design and implementation. Those ordinarily skilled in the art will be able to implement the clock signal line 120 from the description provided herein. As shown in FIG. 1, the clock signal line 120 is a single signal line, however, it will be appreciated that multiple clock signals may be transmitted from the transmitting device to the receiving device. It will be further appreciated that although the clock signal line 120 is illustrated in FIG. 1 as having the CLK signal provided to the receiving device by the transmitting device, the clock signal line 120 can be used to provide a common clock signal from a master system clock generator (not shown) to both the transmitting and receiving devices. Such modifications can be made without departing from the scope of the present invention.

The previously described data bus 110 and clock signal line 120 are similar to a conventional capacitively coupled signaling system. However, the capacitively coupled signaling system 100 further includes a DC balance circuit 130 that addresses the DC balance issues previously discussed with respect to conventional capacitively coupled signaling systems. The DC balance circuit 130 includes DC balance encode circuit 132 and an output driver circuit 134 capacitively coupled through a capacitor 140 to an input buffer circuit 136 and DC balance decode circuit 138. The encode circuit 132 is coupled to the data bus 110 at the transmitting device and the decode circuit 138 is coupled to input buffer 114 at the receiving device. As will be explained in greater detail below, in addition to the transmission of the data signals D0–D7 on the data bus, a DC balance signal DBAL is generated by the encode circuit 132 and transmitted to the decode circuit 138 in order for a receiving device to decode the data signals D0–D7 into corresponding data signals Q0–Q7. In FIG. 1, the DC balance encode circuit 132 and the output driver circuit 134 represent the transmitting device and the input buffer 136 and the DC balance decode circuit 138 represent the receiving device. However, it will be appreciated that the encode circuit 132 can also include circuitry to perform the decode operation of the decode circuit 138 to accommodate a bi-directional data bus 110. Similarly, the decode circuit 138 can include circuitry to perform the encode operation of the encode circuit 132 as well. Moreover, the encode and decode circuits 132, 138 can be located separately from the transmitting and receiving devices, respectively, without departing from the scope of the present invention.

Figure 2:
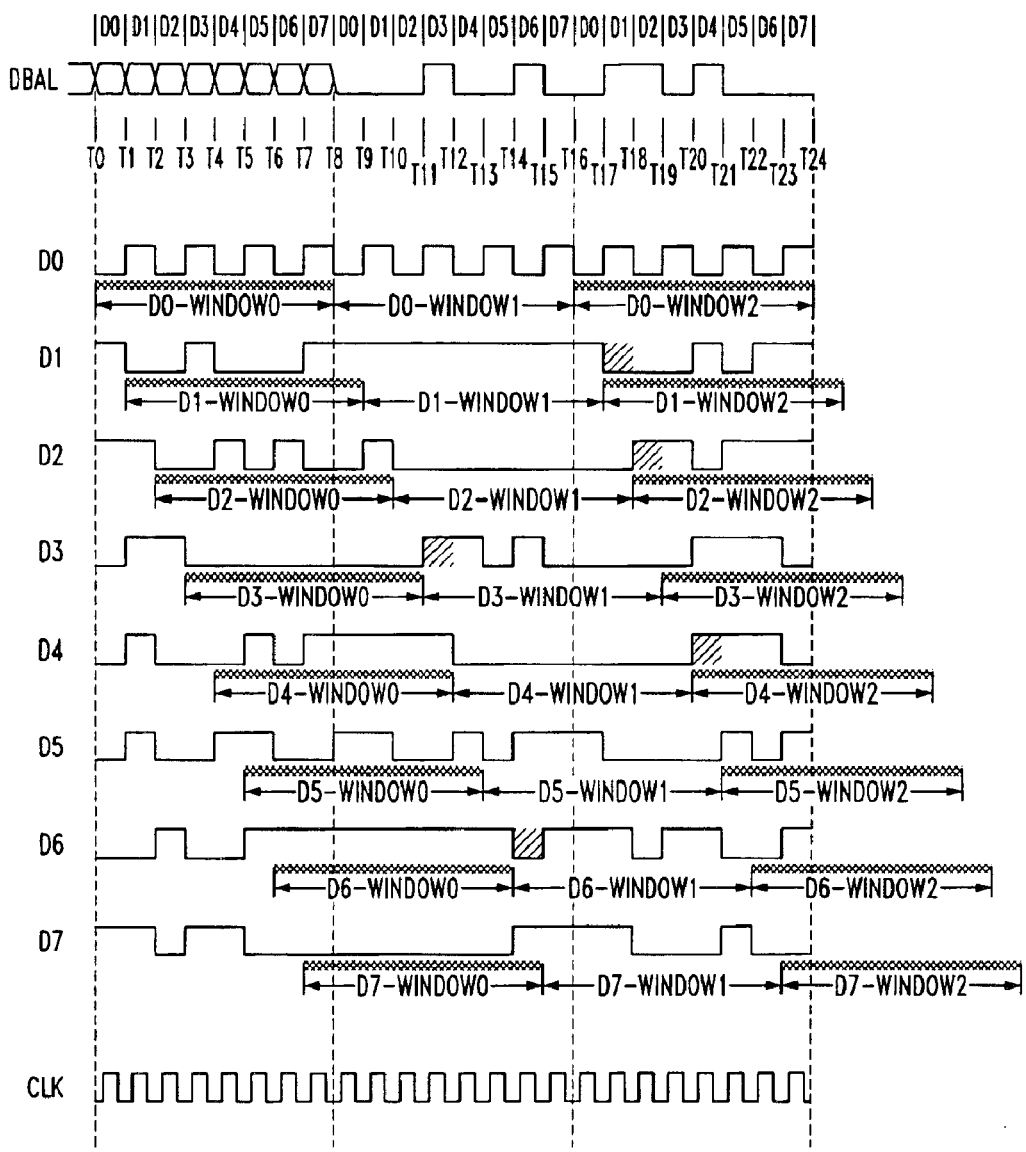
FIG. 2 is a timing diagram of various signals related to the operation of the capacitively coupled signaling system of FIG. 1 in accordance with an embodiment of the present invention.

Operation of a first embodiment of the capacitively coupled signaling system 100 will be described with respect to FIG. 2. FIG. 2 is a timing diagram illustrating various signals during operation of the capacitively coupled signaling system 100. It will be appreciated that other signals may be present during the operation of the capacitively coupled signaling system 100, however, they have not been shown in order to avoid obscuring the present invention. Shown in FIG. 2 are eight data signals D0–D7, the DBAL signal, and the CLK signal that are transmitted from the transmitting device to the receiving device. The data signals D0–D7 represent eight bits of binary data, with the length of time for each bit of data, or bit time, shown in FIG. 2 as times T0–T24.

The encode circuit 132 (FIG. 1) monitors the signal level of each of the data signals D0–D7 over a period of time, or a sample window. The sample windows for the embodiment described by FIG. 2 are eight bit times wide. As will be explained in more detail below, if a respective data signal does not change (i.e., change logic level) during its sample window, that data signal is forcibly inverted by the transmitting device before being transmitted to the receiving device so that a complementary data state is transmitted instead. The inversion of the data signal is flagged by a change in the logic level for the DBAL signal. In the present example, a HIGH logic level indicates that a data signal has been inverted. However, a LOW logic level can also be used to indicate a forced inversion of a data signal as well. The DBAL signal is then used by the decode circuit 138 to recover the correct data by inverting the inverted data signal at the receiving circuit when the changed logic level of the DBAL signal is detected. By forcing the data signals to invert for a bit time after a string of zeroes or ones has occurred, DC balance for the data signals can be maintained.

The sample windows for each of the data signals are staggered by one bit time. For example, the sample window for the D0 signal is from the time T0–T8, the sample window for the D1 signal is from the time T1–T9, and the sample window for the D2 signal is from the time T2–T9. The staggering of the sample windows continues for the D3–D7 signals, with the sample window for the D7 signal between T7–T15. By staggering the sample windows, each bit time of the DBAL signal will correspond to a particular data signal. Thus, as long as the synchronicity between the bit times of the DBAL signal and the bit times of the data signals D0–D7 is maintained, then the decode circuit 138 will be able to invert the correct inverted data signal to recover the correct data for that data signal.

For example, with respect to FIG. 2, the bit time of the DBAL signal between T8–T9 corresponds to the D0 signal for the D0 sample window between T0–T8, and the bit time of the DBAL signal between T16–T17 corresponds to the D0 signal for the sample window between the times T8–T16. Similarly, the bit time of the DBAL signal between T9–T10 corresponds to the D1 signal for the D1 sample window between T1–T9, and the bit time of the DBAL signal between T17–T18 corresponds to the D1 signal for the D1 sample window between T9–T17. As shown in FIG. 2, the DBAL signal maintains a LOW logic level between T8–T10, representing that none of the data signals D0–D2 were forcibly inverted because the logic levels of the data signals D0–D2 changed sometime during the respective sample window. However, looking at the D3 signal, the D3 signal maintains a LOW logic level throughout the D3 sample window between T3–11. As a result, the encode circuit 132 causes the output driver 112 for the D3 signal to invert the D3 signal for a bit time following the D3 sample window, that is, between T3–T11. The logic level of the DBAL signal is also changed by the encode circuit 132 to a HIGH logic level to indicate that the D3 signal has been inverted for the corresponding bit time T11–T12. That is, the D3 signal is inverted at the bit time between T11–T12 (from true data having a LOW logic level to inverted data having a HIGH logic level), and the DBAL signal between the times T11–T12 has a HIGH logic level. On the end of the receiving device, because each bit time of the DBAL signal corresponds to a particular data signal D0–D7, the decode circuit 138 will cause the input buffer to invert the D3 signal for the corresponding bit time in response to receiving the HIGH logic level of the DBAL signal in order to recover the correct data of the D3 signal.

At the time T12, the DBAL signal returns to a LOW logic level, and is maintained at the LOW logic level between T12–T14, because the D4 and D5 signals change logic levels at least once during the respective sample windows T4–T12 and T5–T13, consequently, inversion of the data signals D4 and D5 by the encode circuit 132 is not necessary. In contrast, the D6 signal maintains a HIGH logic level throughout the D6 sample window between T6–T14. As a result, the encode circuit 132 causes the output driver 112 for the D6 signal to invert the signal for a bit time following the sample window (i.e., invert the D6 signal between T14–T15, from true data having a HIGH logic level to inverted data having a LOW logic signal). The DBAL signal changes to a HIGH logic level between the times T14–T15 to indicate that the D6 signal will need to be inverted at the receiving device to recover the correct data for the D6 signal. At the time T15, the DBAL signal returns to a LOW logic level because the D7 signal changes logic levels at least once during the D7 sample window between T7–T15.

Another sample window cycle for the DBAL signal is shown in FIG. 2 at T16–T24. The logic level of the DBAL signal between T16–T24 corresponds to the next set of sample windows for the data signals D0–D7. In summary, the D1 signal is inverted between T17–T18 because a HIGH logic level was maintained through the D1 sample window between T9–T17. Similarly, the D2 signal is inverted between T18–T19 for having a LOW logic level throughout the D2 sample window between T10–T18, and the D4 signal is inverted between T20–T21 because a LOW logic level was maintained throughout the D4 sample window between T12–T20. As a result, the DBAL signal has a LOW logic level between T16–T17 (the D0 signal changed logic levels at least once during the sample window of T8–T16), has a HIGH logic level between T17–T19 (corresponding to the forced inversion of the D1 and D2 signals), has a LOW logic level between T19–T20 (indicating that the D3 signal changed logic levels at least once in the sample window between T11–T19), and has a HIGH logic level between T20–T21 (corresponding to the forced inversion of the D4 signal). The DBAL signal has a LOW logic level for the remainder of the cycle, that is, between T21–T24, indicating that a forced inversion of the D5–D7 signals was not necessary. On the end of the receiving device, the decode circuit 138 will cause the appropriate input buffers 114 to invert the incoming D1, D2, and D4 signals at the appropriate times to recover the correct data of the respective data signals.

It will be appreciated that embodiments of the present invention provide a capacitively coupled signaling system that does not require encoding and decoding of each data signal D0–D7 on the data bus 110. Each data signal on the data bus 110 is merely a bit pipe that does not require retiming or repacketing of the data. Thus, the data transmission using a capacitively coupled signaling system according to an embodiment of the present invention is very efficient because no bits of the data signals are wasted for maintaining DC balance of the signal. Although embodiments of the present invention do require an additional signal line for providing the DBAL signal to a receiving device, encode and decode circuitry as previously described will be relatively small in area, in comparison external device I/O circuitry, for embodiments of the present invention implemented in a SiP environment.

Operation of a second embodiment of the capacitively coupled signaling system 100 will be described with respect to the timing diagram of FIG. 3. In the embodiment described with respect to the timing diagrams of FIG. 2, the DBAL signal itself is not DC balanced, and as such, can potentially drift if the pattern of the data signals D0–D7 results in a DBAL signal consisting of a long string of zeroes or ones. The embodiment described with respect to FIG. 3 addresses this issue by framing the sample window cycle of the DBAL signal with a rising or falling transition of the DBAL signal that occurs during a HIGH logic level of the CLK signal. As a result, the DBAL signal will never have a long string of ones or zeroes.

Figure 3:
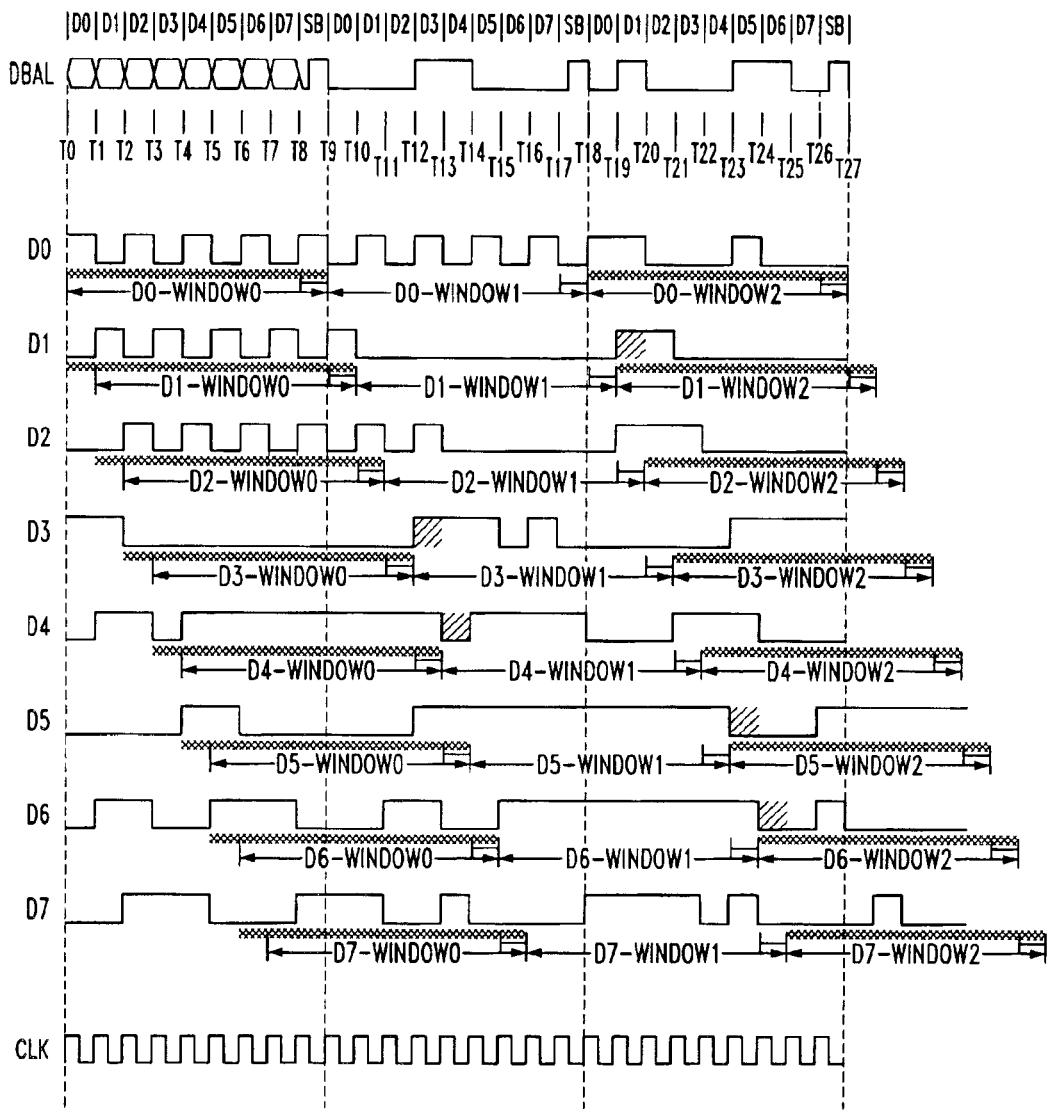
FIG. 3 is a timing diagram of various signals related to the operation of the capacitively coupled signaling system of FIG. 1 in accordance with an embodiment of the present invention.

As with the embodiment of the capacitively coupled signaling system 100 described with respect to FIG. 2, in the embodiment described with respect to FIG. 3, the encode circuit 132 forces a data signal to invert for a bit time following a sample window in the event the data signal maintains a logic HIGH or LOW level throughout the sample window. Also, as with the embodiment described with respect to FIG. 2, the sample windows for each of the data signals D0–D7 are staggered, and consequently, the bit times of the DBAL signal correspond to one of the data signals D0–D7, as well as to a particular bit time of the data signal. As a result, the decode circuit 138 will be able to invert the correct data signal and at the appropriate time, based on the bit time at which the DBAL signal is at a HIGH logic level, in order to recover the true data signal. However, in the embodiment described with respect to FIG. 3, every eight bit times of the DBAL signal is framed by a forced transition of the DBAL signal. With the addition of the forced inversion of the DBAL signal framing every eight bit times, the resulting staggered sample windows of FIG. 3 are nine bit times wide instead of the eight bit times of FIG. 2. Besides the extended sample window, operation of the embodiment described with respect to FIG. 3 is the same as that for the embodiment previously described with respect to FIG. 2.

For example, as shown in FIG. 3, the D0, D1, and D2 signals change logic levels at least once during the respective sample windows, that is, T0–T9 for the D0 signal, T1–T10 for the D1 signal, and T2–T11 for the D2 signal. As a result, the encode circuit 132 generates a DBAL signal having a LOW logic level between the times T9–T12, indicating that the D0, D1, and D2 signals were not forced to invert to maintain DC balance. However, the D3 signal maintains a LOW logic level throughout the D3 sample window between T2–T12. In response, the encode circuit 132 forces the D3 signal to invert logic levels from a true data having a LOW logic level to an inverted data having a HIGH logic level between T12–T13, and further changes the logic level of the DBAL signal to a HIGH logic level between T12–T13. Similarly, with respect to the D4 signal, the encode circuit 132 forces the D4 signal to invert for the bit time between T13–T14 in response to the D4 signal maintaining a HIGH logic level throughout the D4 sample window between T4–T13. The encode circuit 132 further generates a DBAL signal having a HIGH logic level between T13–T14. The remaining data signals D5–D7 change logic levels at least once during the respective sample windows, and as a result, the DBAL signal has a LOW logic level from T14–T17. As previously discussed, the DBAL signal is used by the decode circuit 138 at the receiving device to recover the true data for the D3 and D4 signals by inverting the inverted D3 and D4 signals at the appropriate bit times.

A forced logic transition of the DBAL signal is made at T17–T18 for the purpose of DC balancing the DBAL signal, as previously discussed. A rising edge transition is made because the DBAL signal is at a low logic level when the CLK signal is HIGH between T17–T18. At the time T18, a new sample window cycle of the DBAL signal for the data signals D0–D7 begins. As shown in FIG. 3, because the D0 signal makes at least one transition during the D0 samples window between T9–T18, the DBAL signal for T18–T19 has a LOW logic level. However, in response to the D1 signal having a LOW logic level throughout the D1 sample window between T10–T19, the D1 signal is forced to invert during the bit time between T19–T20, and the DBAL signal has a HIGH logic level between T19–T20 as well. The D2, D3, and D4 signals have logic transitions during their respective sample windows, and consequently, the DBAL signal maintains a LOW logic level between T20–T23, indicating that a forced inversion of the D2–D4 signals were not necessary. The D5 and D6 signals, on the other hand, maintain HIGH logic levels throughout their respective sample windows, that is, T14–T23 for the D5 signal and T15–T24 for the D6 signal. In response, the encode circuit 132 forces the D5 signal to a complementary state between T23–T24 and forces the D6 signal to a complementary data state between T24–T25. The encode circuit 132 further generates a DBAL signal having a HIGH logic level between T23–T25. The D7 signal makes several transitions during its sample window of T16–T25, causing the DBAL signal to have a LOW logic level for the time T25–T26. At the bit time between T26–T27, the DBAL signal is forced to a HIGH logic level for the purpose of DC balancing the DBAL signal.

The embodiments of the capacitively coupled signaling system previously described have been provided by way of example, and are not intended to limit the scope of the present invention. It will be appreciated that modifications can be made to the previously described embodiments without departing from the scope of the present invention. For example, in an alternative embodiment of the present invention, a data bus wider than eight bits is used to transmit data from a transmitting device to a receiving device. One alternative embodiment implements a capacitively coupled signaling system according to the present invention by extending the length of the sample window for each of the data signals. For example, where the data bus is 32-bits wide having data signals D0–D31, the sample window can be 32 bit times in length. As a result, each bit time of the DBAL signal will correspond to one of the 32 data signals. It will be appreciated that having a longer sample window, such as 32 bit times in length, may be too long to maintain DC balance, and to allow the data signals D0–D31 to drift.

In another embodiment of the present invention, multiple DBAL signals are used for data busses of greater data widths. For example, for a data bus 32-bits wide and having data signals DO–D31, four DC balance signals, DBAL0, DBAL1, DBAL2, and DBAL3 can be used to maintain DC balance between the transmitting and receiving device. Each of the DBAL signals represent eight bits of the 32-bit wide data bus, and are used by the receiving device to decode the respective eight data signals.

It will be further appreciated that the length of the sample windows should be selected to maintain DC balance of signal lines between a transmitting and receiving device. As previously discussed, a sample window should not be so long that DC balance is not maintained and allows a signal to drift. Moreover, worst case conditions may be considered in choosing appropriate sample window lengths. For example, it is possible for a data signal to maintain the same logic level for nearly twice the length of a sample window where a transition occurs in the bit time immediately after a first sample window begins, thus, changing logic levels at least once during a first sample window, and another transition occurs in the bit time immediately before a second sample window ends. However, such considerations are well within the skill of those in the art, and the description provided herein is sufficient to allow those of ordinary skill to practice the present invention.

Figure 4:
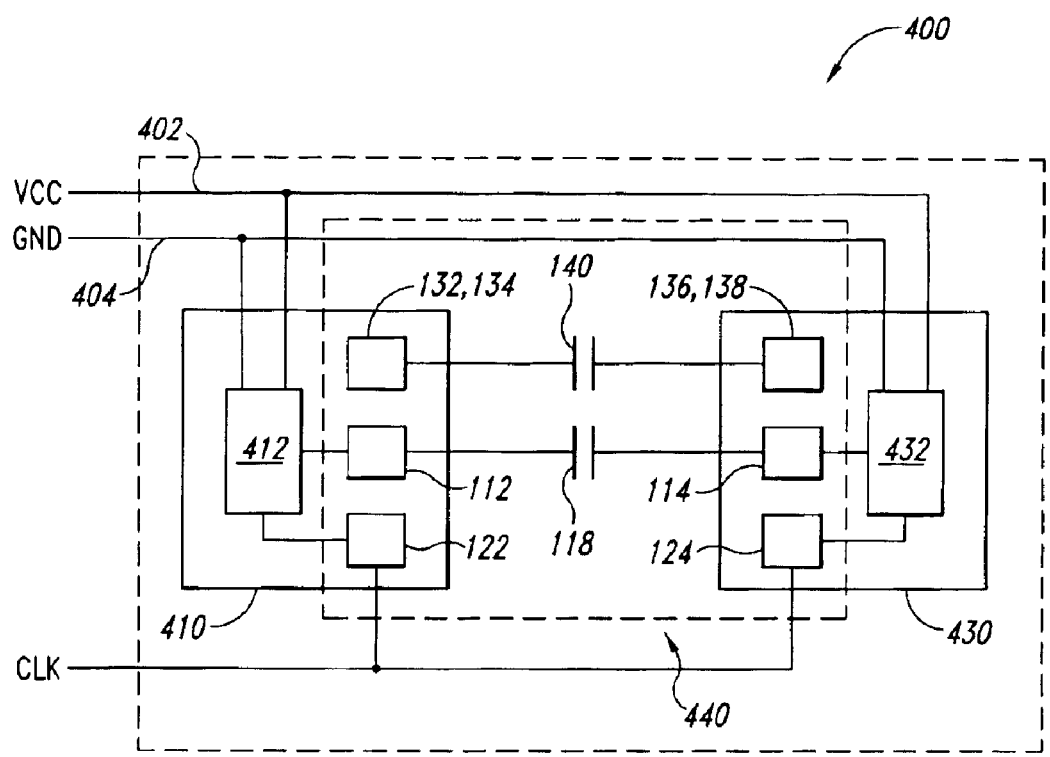
FIG. 4 is a block diagram of a system-in-package device including an embodiment of the present invention.

FIG. 4 illustrates a system-in-package (SiP) device 400 in which embodiments of the present invention can be implemented. The SiP device 400 includes a first discrete system 410 and a second discrete system 430. Both the first and second discrete systems 410, 420 are coupled to a voltage bus 402 and a ground bus 404 to provide power to the systems 410, 412. The first and second discrete systems 410, 430 include functional circuitry 412, 432, respectively, that perform various operations. The functional circuitry 412 and 432 are conventional, and may include well known circuitry such as memory circuits, signal processing circuits, data processing circuits, mixed-signal circuits, and the like. The first and second discrete systems 410, 430 are coupled together using a capacitively coupled signaling system 440 according to an embodiment of the present invention. As shown in FIG. 4, the first discrete system 410 includes encode circuit 132, data output drivers 112, and a clock buffer 122, and the second discrete system 430 includes decode circuitry 138, data input buffer circuits 114, and a clock buffer 124. The clock buffers 122, 124 are coupled to an external clock signal CLK for synchronization. The capacitively coupled signaling system 440 allows the first and second discrete systems 410, 430 to communicate with one another over signal lines that are DC balanced, as previously described. It will be appreciated that FIG. 4 is merely representative of an SiP device, and additional circuitry, discrete systems, and signal lines can be included as well without departing from the scope of the present invention. For example, additional passive components (not shown), such as resistors and capacitors can be included for biasing, decoupling, bypassing, matching, and the like. Additional components have been omitted from FIG. 4 in order to avoid obscuring the present invention.

From the foregoing it will be appreciated that, although specific embodiments of the invention have been described herein for purposes of illustration, various modifications may be made without deviating from the spirit and scope of the invention. For example, the DBAL signal has been illustrated and described as being capacitively coupled between the DC balance encode circuit 132 and the DC balance decode circuit 138. However, the encode and decode circuits could be coupled directly together, and the DBAL signal provided over a continuous signal line. In this embodiment, DC balance of the DBAL signal itself would not be necessary because of the electrical coupling between the encode and decode circuits. Accordingly, the invention is not limited except as by the appended claims.

What is claimed is:

1. A signal balancing circuit for capacitively coupled signaling between transmitting and receiving devices both receiving a synchronizing clock signal, the signal balancing system comprising:

a plurality of capacitively coupled signal lines on which data signals are transmitted from the transmitting device to the receiving device, the data signals representing streams of binary data having a data interval to which each binary digit corresponds;

an encode circuit having an output at which a balancing signal is provided, the encode circuit coupled to each capacitively coupled signal line to monitor each data signal over a respective time interval for a change in logic states, the encode circuit inverting a data signal for a data interval in response to the data signal maintaining the same logic state throughout the time interval and further generating a balancing signal having a logic level and a timing relative to the time intervals of the respective data signals indicative of inversion of a particular data signal; and a decode circuit coupled to the encode circuit to receive the balancing signal and further coupled to the capacitively coupled signal lines to invert the data signals for the data interval according to the logic level and timing of the balancing signal.

2. The signal balancing system of claim 1 wherein the decode circuit is capacitively coupled to the encode circuit to receive the balancing signal.

3. The signal balancing system of claim 1 wherein the plurality of capacitively coupled signal lines comprises n signal lines and the encode circuit monitors each data signal over a time interval of n data intervals for a signal transition.

4. The signal balancing system of claim 1 wherein the plurality of capacitively coupled signal lines comprises n signal lines, n being a multiple of eight, and the encode circuit monitors each data signal over a time interval of eight data intervals for a signal transition.

5. The signal balancing system of claim 1 wherein the plurality of capacitively coupled signal lines comprises n signal lines and the encode circuit monitors each data signal over a time interval of (n+1) data intervals for a signal transition.

6. The signal balancing system of claim 5 wherein the encode circuit monitors each data signal over respective time intervals that are staggered by one data interval with respect to one another.

7. The signal balancing system of claim 5 wherein the decode circuit is capacitively coupled to the encode circuit to receive the balance signal and the encode circuit generates a balance signal having a signal transition following every n data intervals.

8. The signal balancing system of claim 1 wherein the synchronizing clock signal is capacitively coupled between the transmitting and receiving devices.

9. The signal balancing system of claim 1, further comprising a plurality of output buffers and input buffers coupled to the plurality of capacitively coupled signal lines, and wherein the output buffers and encode circuit are integrated with the transmitting device and the input buffers and the decode circuit are integrated with the receiving device.

10. A signal balancing system for capacitively coupled data signaling between a transmitting device and a receiving device both receiving a synchronizing clock signal, the signal balancing system comprising:

a plurality of output buffers for driving a corresponding plurality of data signals;

a corresponding plurality of input buffers for receiving the plurality of data signals;

a corresponding plurality of capacitively coupled signal lines coupled between the output buffers and the input buffers on which the plurality of data signals are transmitted from the transmitting device to the receiving device;

an encode circuit having an output at which a balance signal is provided and coupled to each of the capacitively coupled signal lines to monitor each data signal for a signal transition occurring within repeating and non-overlapping time intervals, the repeating time intervals for each of the data signals equal in length of time and equally staggered with respect to one another over the length of time of one time interval, the encode circuit further coupled to each of the plurality of output buffers to cause a data signal to be inverted prior to transmission in the event the respective data signal does not change logic states over an immediately preceding time interval and generate a balance signal at a time and having a first logic level indicative of whether a data signal has been inverted and which of the plurality of data signals was inverted; and a decode circuit coupled to the encode circuit to receive the balance signal and further coupled to each of the input buffers to cause an input buffer to invert the respective data signal received from the transmitting device in response to receiving the balance signal having the first logic level at the time corresponding to the inverted data signal.

11. The signal balancing system of claim 10 wherein the decode circuit is capacitively coupled to the encode circuit to receive the balance signal.

12. The signal balancing system of claim 10 wherein the plurality of capacitively coupled signal lines comprises n signal lines and the encode circuit monitors each data signal over a time interval of n bit intervals for a signal transition.

13. The signal balancing system of claim 10 wherein the plurality of capacitively coupled signal lines comprises n signal lines, n being a multiple of eight, and the encode circuit monitors each data signal over a time interval of eight bit intervals for a signal transition.

14. The signal balancing system of claim 10 wherein the plurality of capacitively coupled signal lines comprises n signal lines and the encode circuit monitors each data signal over a time interval of (n+1) bit intervals for a signal transition.

15. The signal balancing system of claim 14 wherein the encode circuit monitors each data signal over respective time intervals that are staggered by one bit interval with respect to one another.

16. The signal balancing system of claim 14 wherein the decode circuit is capacitively coupled to the encode circuit to receive the balance signal and the encode circuit generates a balance signal having a signal transition following every n bit intervals.

17. The signal balancing system of claim 10 wherein the synchronizing clock signal is capacitively coupled between the transmitting and receiving devices.

18. The signal balancing system of claim 10 wherein the output buffers and encode circuit are integrated with the transmitting device and the input buffers and the decode circuit are integrated with the receiving device.

19. A system in package (SiP) device, comprising:

a first device having a clock terminal to which a clock signal is applied and further having a first plurality of data terminals;

a second device having a clock terminal to which the clock signal is applied and further having a second plurality of data terminals;

a plurality of capacitively coupled signal lines coupled to the first and second plurality of data terminals on which data signals are transmitted between the first and second devices; and a signal balancing circuit for capacitively coupled signaling between the first and second devices, the signal balancing system comprising:

an encode circuit having an output at which a balancing signal is provided, the encode circuit coupled to each capacitively coupled signal line to monitor each data signal over a respective time interval for a change in logic states, the encode circuit inverting a data signal for a data interval in response to the data signal maintaining the same logic state throughout the time interval and further generating a balancing signal having a logic level and a timing relative to the time intervals of the respective data signals indicative of inversion of a particular data signal; and a decode circuit coupled to the encode circuit to receive the balancing signal and further coupled to the capacitively coupled signal lines to invert the data signals for the data interval according to the logic level and timing of the balancing signal.

20. The SiP device of claim 19 wherein the decode circuit of the signal balancing circuit is capacitively coupled to the encode circuit to receive the balancing signal.

21. The SiP device of claim 19 wherein the plurality of capacitively coupled signal lines comprises n signal lines and the encode circuit of the signal balancing system monitors each data signal over a time interval of n data intervals for a signal transition.

22. The SiP device of claim 19 wherein the plurality of capacitively coupled signal lines comprises n signal lines, n being a multiple of eight, and the encode circuit of the signal balancing system monitors each data signal over a time interval of eight data intervals for a signal transition.

23. The SiP device of claim 19 wherein the plurality of capacitively coupled signal lines comprises n signal lines and the encode circuit of the signal balancing system monitors each data signal over a time interval of (n+1) data intervals for a signal transition.

24. The SiP device of claim 23 wherein the encode circuit of the signal balancing system monitors each data signal over respective time intervals that are staggered by one data interval with respect to one another.

25. The SiP device of claim 23 wherein the decode circuit of the signal balancing system is capacitively coupled to the encode circuit to receive the balance signal and the encode circuit generates a balance signal having a signal transition following every n data intervals.

26. The SiP device of claim 19 wherein the clock signal is capacitively coupled between the transmitting and receiving devices.

27. The SiP device of claim 19 wherein the signal balancing system further comprises a plurality of output buffers and input buffers coupled to the plurality of capacitively coupled signal lines, and wherein the output buffers and encode circuit are integrated with the transmitting device and the input buffers and the decode circuit are integrated with the receiving device.

28. A computer system, comprising:
a data input device;
a data output device;
a processor coupled to the data input and output devices;
a memory device coupled to the processor; and
a system in package (SiP) device coupled to the processor, the SiP device comprising:
   a first device having a clock terminal to which a clock signal is applied and further having a first plurality of data terminals;
   a second device having a clock terminal to which the clock signal is applied and further having a second plurality of data terminals;
   a plurality of capacitively coupled signal lines coupled to the first and second plurality of data terminals on which data signals are transmitted between the first and second devices; and
   a signal balancing circuit for capacitively coupled signaling between the first and second devices, the signal balancing system comprising:
      an encode circuit having an output at which a balancing signal is provided, the encode circuit coupled to each capacitively coupled signal line to monitor each data signal over a respective time interval for a change in logic states, the encode circuit inverting a data signal for a data interval in response to the data signal maintaining the same logic state throughout the time interval and further generating a balancing signal having a logic level and a timing relative to the time intervals of the respective data signals indicative of inversion of a particular data signal; and
      a decode circuit coupled to the encode circuit to receive the balancing signal and further coupled to the capacitively coupled signal lines to invert the data signals for the data interval according to the logic level and timing of the balancing signal.

29. The computer system of claim 28 wherein the decode circuit of the signal balancing circuit is capacitively coupled to the encode circuit to receive the balancing signal.

30. The computer system of claim 28 wherein the plurality of capacitively coupled signal lines comprises n signal lines and the encode circuit of the signal balancing system monitors each data signal over a time interval of n data intervals for a signal transition.

31. The computer system of claim 28 wherein the plurality of capacitively coupled signal lines comprises n signal lines, n being a multiple of eight, and the encode circuit of the signal balancing system monitors each data signal over a time interval of eight data intervals for a signal transition.

32. The computer system of claim 28 wherein the plurality of capacitively coupled signal lines comprises n signal lines and the encode circuit of the signal balancing system monitors each data signal over a time interval of (n+1) data intervals for a signal transition.

33. The computer system of claim 32 wherein the encode circuit of the signal balancing system monitors each data signal over respective time intervals that are staggered by one data interval with respect to one another.

34. The computer system of claim 32 wherein the decode circuit of the signal balancing system is capacitively coupled to the encode circuit to receive the balance signal and the encode circuit generates a balance signal having a signal transition following every n data intervals.

35. The computer system of claim 28 wherein the clock signal is capacitively coupled between the transmitting and receiving devices.

36. The computer system of claim 28 wherein the signal balancing system further comprises a plurality of output buffers and input buffers coupled to the plurality of capacitively coupled signal lines, and wherein the output buffers and encode circuit are integrated with the transmitting device and the input buffers and the decode circuit are integrated with the receiving device.

37. A method of balancing a plurality of capacitively coupled data signals, comprising:
   monitoring each of the data signals for a signal transition over respective repeating non-overlapping time intervals, the time intervals for each data signal staggered in time relative to one another over a time interval;
   inverting a data signal for a data interval in response to the data signal maintaining a logic level throughout the respective time interval;
   generating a balancing signal having a logic level and timing relative to the time intervals of the respective data signals indicative of inversion of a data signal for a data interval; and
   inverting inverted data signals for the data interval in accordance with the balancing signal.

38. The method of claim 37 wherein monitoring each of the data signals for a signal transition over respective repeating non-overlapping time intervals comprises monitoring each of n data signals over time intervals of n data intervals.

39. The method of claim 37 wherein monitoring each of the data signals for a signal transition over respective repeating non-overlapping time intervals comprises monitoring each of n data signals over time intervals of (n+1) data intervals.

40. The method of claim 39 wherein generating a balancing signal comprises generating a balancing signal having a signal transition following every n data intervals.

41. A method for balancing a plurality of data signals on a corresponding plurality of capacitively coupled data lines, the method comprising:
   evaluating the data signals for signal transitions occurring within a respective time interval, each data signal have a time interval of equal time and staggered in time with respect to the time intervals of the other signals;
   where a data signal maintains the same logic level for the time interval, forcing a signal transition of the data signal from an original logic level to a complementary logic level and generating a balance signal having a logic level and timing with respect to the time interval of the data signal indicative of the forced transition of the particular data signal; and
   forcing a transition of the transitioned signal at the appropriate time in accordance with the balance signal to recover the original logic level of the data signal.

42. The method of claim 41 wherein evaluating the data signals for a signal transitions occurring within a respective time interval comprises monitoring each of n data signals over respective time intervals of n bit intervals.

43. The method of claim 41 wherein evaluating the data signals for a signal transitions occurring within a respective time interval comprises monitoring each of n data signals over respective time intervals of (n+1) bit intervals.

44. The method of claim 43 wherein generating a balancing signal comprises generating a balancing signal having a signal transition following every n data intervals.

* * * * *